(12) United States Patent
Kim

(10) Patent No.: US 8,526,239 B2
(45) Date of Patent: Sep. 3, 2013

(54) SEMICONDUCTOR MEMORY DEVICE AND METHOD OF OPERATING THE SAME

(75) Inventor: Hyung Seok Kim, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 152 days.

(21) Appl. No.: 13/096,870

(22) Filed: Apr. 28, 2011

(65) Prior Publication Data

US 2011/0267892 A1  Nov. 3, 2011

(30) Foreign Application Priority Data

Apr. 29, 2010 (KR) .................. 10-2010-0039897

(51) Int. Cl.
  *G11C 16/06* (2006.01)
  *G11C 16/04* (2006.01)

(52) U.S. Cl.
  USPC ............ 365/185.22; 365/185.03; 365/185.21; 365/185.25

(58) Field of Classification Search
  USPC .................................................. 365/185.22
  See application file for complete search history.

(56) References Cited

U.S. PATENT DOCUMENTS

| | | | | |
|---|---|---|---|---|
| 7,532,516 B2* | 5/2009 | Nguyen et al. | ........... | 365/185.21 |
| 7,561,474 B2* | 7/2009 | Kim et al. | ................ | 365/185.22 |
| 7,782,681 B2* | 8/2010 | Kim et al. | ................ | 365/185.29 |
| 2006/0034128 A1* | 2/2006 | Han et al. | ................ | 365/185.29 |
| 2010/0284227 A1* | 11/2010 | Choi et al. | ............... | 365/185.22 |
| 2011/0069554 A1* | 3/2011 | Lo Giudice et al. | ..... | 365/185.21 |

FOREIGN PATENT DOCUMENTS

| | | |
|---|---|---|
| JP | 09-180475 | 7/1997 |
| KR | 1020010055299 | 7/2001 |
| KR | 1020050064033 | 6/2005 |
| KR | 1020100006666 | 1/2010 |
| KR | 1020100087804 | 8/2010 |
| KR | 1020120098078 | 9/2012 |

OTHER PUBLICATIONS

Notice of Allowance issued from the Korean Intellectual Property Office on Feb. 9, 2012.

* cited by examiner

*Primary Examiner* — Son Mai
(74) *Attorney, Agent, or Firm* — IP & T Group LLP

(57) ABSTRACT

A semiconductor memory device includes a memory string coupled to a bit line, a page buffer configured to sense a sensing current of the bit line in an erase verification operation or a program verification operation, and a sensing control circuit configured to differently set a level of the sensing current in the erase verification operation and the program verification operation in order to sense the threshold voltage level of a selected memory cell of the memory string.

18 Claims, 4 Drawing Sheets

SEMICONDUCTOR MEMORY DEVICE AND METHOD OF OPERATING THE SAME

CROSS-REFERENCE TO RELATED APPLICATION

Priority to Korean patent application number 10-2010-0039897 filed on Apr. 29, 2010, the entire disclosure of which is incorporated by reference herein, is claimed.

BACKGROUND

Exemplary embodiments relate to a semiconductor memory device and a method of operating the same and, more particularly, to a semiconductor memory device and a method of operating the same, which are capable of optimizing operating conditions.

A semiconductor memory device receives and stores data. In nonvolatile memory devices, such as flash memory, data is stored through a program operation, data is deleted through an erase operation, and data is outputted through a read operation.

In the flash memory device, the threshold voltage level of a memory cell is shifted according to data stored in the memory cell. That is, the threshold voltage of a memory cell is shifted through a program operation or an erase operation. In order to check whether the threshold voltage of the memory cell has shifted to a target voltage, a program verification operation or an erase verification operation is performed.

In a common flash memory device, when a bit line is precharged to a first voltage and a verification voltage is supplied to the gate of a memory cell coupled to the bit line, voltage of the bit line remains intact or shifts according to the difference between the verification voltage and a threshold voltage of the memory cell. The threshold voltage of the memory cell can be checked based on a change in the voltage of the bit line. The threshold voltage of the memory cell is checked based on a sensing current level detected in a program verification operation performed after a program operation and detected in an erase verification operation performed after an erase operation.

After the erase operation, the threshold voltage level of a memory cell becomes lower than 0 V. In the erase verification operation, the threshold voltage level of the memory cell that is sensed should be lower than 0 V.

Unlike in a program verification operation, in an erase verification operation, the threshold voltages of memory cells coupled to a bit line are sensed by supplying the same erase verification voltage to all the gates of the memory cells. Here, the erase verification voltage supplied to the gates is lower than a read pass voltage which is supplied to the gates of unselected memory cells when a read operation is performed on memory cells on which a program operation has been performed. Accordingly, an actually sensed threshold voltage is lower than the voltage supplied to the gates. This is called a back pattern dependency (BPD) effect. Consequently, a threshold voltage of a negative potential can be sensed even without using a negative voltage.

Meanwhile, with an increase in the number of program and erase cycles, the influence of current degradation is increased and so an erase verification level gradually shows a downward tendency. When the erase verification level gradually falls, the level of an erase voltage supplied for the erase operation gradually rises, and the electrical properties of a memory cell are deteriorated.

Furthermore, with an increase in the number of program and erase cycles, a threshold voltage level shifts according to the level of a sensing current. Accordingly, the level of an erase voltage supplied during the erase operation is influenced.

BRIEF SUMMARY

Exemplary embodiments relate to a semiconductor memory device and a method of operating the same, which are capable of minimizing the deterioration of physical and electrical properties of the memory device resulting from repeated program and erase operations and capable of improving reliability of the operation by differently setting conditions for sensing data (or threshold voltage) of a memory cell.

An exemplary semiconductor memory device according to an aspect of the present disclosure includes a memory string coupled to a bit line, a page buffer configured to sense a sensing current of the bit line in an erase verification operation or a program verification operation, and a sensing control circuit configured to differently set a level of the sensing current in the erase verification operation and the program verification operation in order to sense the threshold voltage level of a selected memory cell of the memory string.

The sensing control circuit can control the level of the sensing current in proportion to the threshold voltage level of the selected memory cell.

The level of the sensing current for the erase verification operation may be set to a first level, the level of the sensing current for a program verification operation of a first program level may be set to a second level which is higher than the first level, the level of the sensing current for a program verification operation of a second program level may be set to a third level which is higher than the second level, and the level of the sensing current for a program verification operation of a third program level may be set to a fourth level which is higher than the third level.

The level of the sensing current of the bit line is higher than the level of the sensing current of the bit line in the erase verification operation.

The sensing control circuit can comprise a sensing voltage generator configured to generate a first voltage when the bit line is precharged and to generate a second voltage, which is lower than the first voltage, when the sensing current is supplied from the bit line to the page buffer, and a sensing circuit configured to control a connection of the bit line and the page buffer according to the first voltage or the second voltage.

The sensing voltage generator can generate the second voltage, having a higher level when data of the selected memory cell is verified in the program verification operation than when the data of the selected memory cell is verified in the erase verification operation.

The sensing voltage generator can generate the second voltage having a first sensing level in the erase verification operation, the sensing voltage generator can generate the second voltage having a second sensing level, which is higher than the first sensing level, in a program verification operation of a first program level, the sensing voltage generator can generate the second voltage having a third sensing level, which is higher than the second sensing level, in a program verification operation of a second program level, and the sensing voltage generator can generate the second voltage having a fourth sensing level, which is higher than the third sensing level, in a program verification operation of a third program level.

The sensing voltage generator can generate the first voltage, having a higher level when data of the selected memory cell is verified in the program verification operation than when the data of the selected memory cell is verified in the erase verification operation.

The sensing voltage generator can generate the first voltage having a first precharge level in the erase verification operation, the sensing voltage generator can generate the first voltage having a second precharge level, which is higher than the first precharge level, in a program verification operation of a first program level, the sensing voltage generator can generate the first voltage having a third precharge level, which is higher than the second precharge level, in a program verification operation of a second program level, and the sensing voltage generator generates the first voltage having a fourth precharge level, which is higher than the third precharge level, in a program verification operation of a third program level.

An evaluation time may be decreased by the sensing voltage generator, which elapses from the time the first voltage is supplied until the second voltage is supplied, when the program verification operation is performed than when the erase verification operation is performed.

The evaluation time may be set to a first value in the erase verification operation, the evaluation time may be set to a second value, which is less than the first value, in a program verification operation of a first program level, the evaluation time may be set to a third value, which is less than the second value, in a program verification operation of a second program level, and the evaluation time may be set to a fourth value, which is less than the third value, in a program verification operation of a third program level.

An exemplary method of operating a semiconductor memory device according to another aspect of this disclosure includes performing an erase operation on a memory string coupled to a bit line, setting a level of a sensing current to a first level and performing an erase verification operation for verifying a stored data in a selected memory cell of the memory string after the erase operation, performing a program operation on the selected memory cell, and setting a level of the sensing current for a program verification operation to one of several program levels which is higher than the first level and performing the program verification operation for verifying the stored data in the memory cell after the program operation.

The level of the sensing current may be set to a second level in a program verification operation of a first program level, the level of the sensing current may be set to a third level which is higher than the second level in a program verification operation of a second program level, and the level of the sensing current may be to a fourth level which is higher than the third level in a program verification operation of a third program level.

An exemplary method of operating a semiconductor memory device according to yet another aspect of this disclosure includes performing an erase operation on a memory string coupled to a bit line, precharging the bit line to a first bit line voltage after the erase operation, performing an erase verification operation by sensing a change of a voltage of the bit line, performing a program operation on a selected memory cell, precharging the bit line to one of several bit line voltages, which is higher than the first bit line voltage, after the program operation, and performing a program verification operation by sensing a change of a voltage of the bit line.

The bit line may be precharged to a second bit line voltage, which is higher than the first bit line voltage in a program verification operation of a first program level, the bit line may be precharged to a third bit line voltage, which is higher than the second bit line voltage in a program verification operation of a second program level, and the bit line may be precharged to a fourth bit line voltage, which is higher than the third bit line voltage in a program verification operation of a third program level.

An exemplary method of operating a semiconductor memory device according to still another aspect of this disclosure includes performing an erase operation on a memory string coupled to a bit line, precharging the bit line after performing the erase operation, performing an erase verification operation by sensing a change of a voltage of the bit line after an evaluation time having a first value, performing a program operation on a selected memory cell, precharging the bit line after performing the program operation, and performing a program verification operation by sensing a change of a voltage of the bit line after an evaluation time having one value of several values, which is less than the first value.

The evaluation time may be a time for which data stored in the selected memory cell is verified, and is a time elapsing from a time when a first voltage for precharging the bit line is supplied until a second voltage for sensing the change of the voltage of the bit line is supplied.

The evaluation time may be set to a second value which is less than the first value in a program verification operation of a first program level, the evaluation time may be set to a third value which is less than the second value in a program verification operation of a second program level, and the evaluation time is set to a fourth value which is less than the third value in a program verification operation of a third program level.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
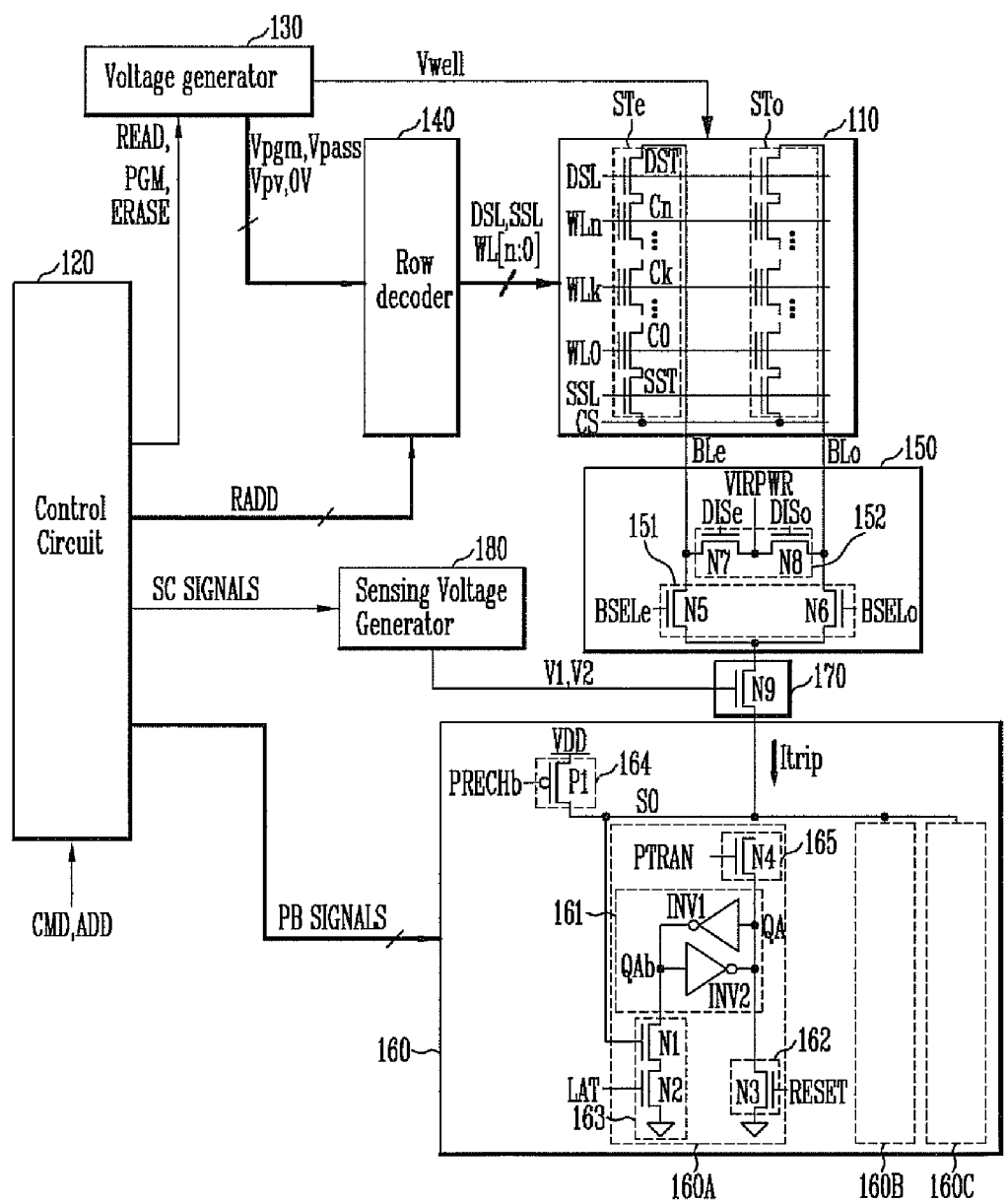
FIGS. 1A and 1B are diagrams illustrating a semiconductor memory device according to the present disclosure.
Figure 1B:
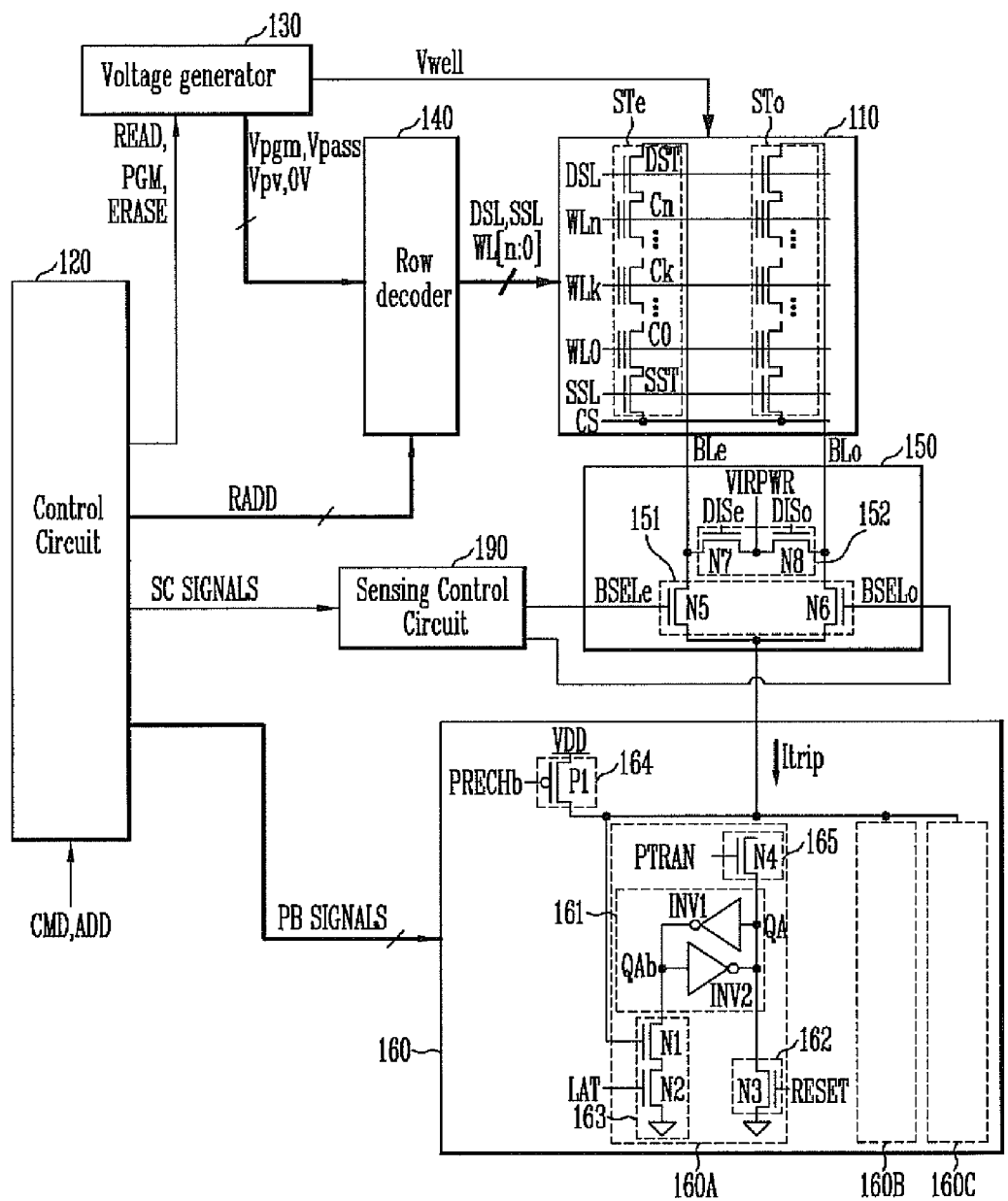

FIGS. 1A and 1B are diagrams illustrating a semiconductor memory device according to the present disclosure.

Referring to FIG. 1A, the semiconductor memory device includes a memory array 110, a control circuit 120, a voltage supply circuit (130, 140), a bit line selection circuit 150, a page buffer 160, and a sensing control circuit (170 and 180).

The memory array 110 may include a plurality of memory blocks. Each of the memory blocks is coupled to bit lines BLe and BLo, and includes memory strings STe and STo coupled in parallel to a common source line CS. For convenience, only one memory block, including the two memory strings STe and STo are shown in FIG. 1A.

Each (for example, STe) of the memory strings includes a drain select transistor DST, a cell string, and a source select transistor SST coupled in series between a bit line (for example, BLe) and the common source line CS. The cell string includes memory cells C0 to Cn (where 'n' may be any natural number) coupled in series between the drain select transistor DST and the source select transistor SST.

More particularly, the drain select transistor DST is coupled between the bit line BLe and the cell string C0 to Cn and is configured to couple the cell string C0 to Cn and the bit line BLe according to a voltage supplied to a drain select line DSL. The memory cells C0 to Cn are operated according to voltages supplied to word lines WL0 to WLn, respectively. The source select transistor SST is coupled between the cell string C0 to Cn and the common source line CS and is configured to couple the cell string C0 to Cn and the common source line CS according to a voltage supplied to a source select line SSL.

Meanwhile, memory cells coupled to one word line (for example, WL0) are referred to as a page. Furthermore, even-numbered memory cells coupled to the even-numbered bit lines BLe, from among the memory cells coupled to the word line WL0, are referred to as an even page. Similarly, odd-numbered memory cells coupled to the odd-numbered bit lines BLo, from among the memory cells coupled to the word line WL0, are referred to as an odd page. The page is a basic unit of a program operation, and the memory block is a basic unit of the erase operation. In other words, a program operation is performed on a page-by-page basis, while an erase operation is performed on a memory block-by-memory block basis.

The control circuit 120 internally generates a program operation signal PGM, a read operation signal READ, or an erase operation signal ERASE in response to a command signal CMD and also generates control signals PB SIGNALS (for example, PRECHb, PTRAN, LAT, and RESET) for controlling internal circuits, such as the page buffer 160, according to the type of an operation. Furthermore, the control circuit 120 internally generates a row address signal RADD and a column address signal (not shown) in response to an address signal ADD.

The voltage supply circuit (130, 140) supplies operation voltages for the program operation, erase operation, or read operation to a selected memory block in response to the signals READ, PGM, ERASE, and RADD generated by the control unit 120. The voltage supply circuit (130, 140) includes a voltage generator 130 and a row decoder 140, which are described in more detail below.

The voltage generator 130 outputs voltages (for example, Vpgm, Vpass, Vpv, and 0 V) for the program operation or the read operation of memory cells according to operation voltages PGM and READ (that is, the internal command signals of the control circuit 120). Furthermore, in the erase operation of memory cells, the voltage generator 130 generates a voltage Vwell to be provided to the bulk (for example, a P-well) of a memory block in response to the erase operation signal ERASE.

The row decoder 140 transfers the operation voltages of the voltage generator 130 to the strings STe and STo of a memory block, selected from among the memory blocks of the memory array 110, in response to the row address signal RADD of the control circuit 120. That is, the operation voltages are supplied to the local lines (i.e., the drain select line DSL, word lines WL0 to WLn, and source select line SSL) of the selected memory block.

The bit line selection circuit 150 selects the even bit line BLe or the odd bit line BLo in response to a bit line selection signal BSELe or BSELo. The selected bit line is coupled to the page buffer 160 through the sensing circuit 170 of the sensing control circuit. Furthermore, the bit line selection circuit 150 functions to precharge or discharge both or one of the even bit line BLe and the odd bit line BLo. To this end, the bit line selection circuit 150 includes a bit line coupling circuit 151 and a discharge circuit 152.

The discharge circuit 152 includes switching elements N7, N8 for coupling the respective bit lines BLe, BLo to a virtual voltage source VIRPWR in response to discharge control signals DISe and DISo. The discharge circuit 152 may precharge or discharge both the bit lines BLe, BLo by turning on both of the switching elements N7, N8 or may precharge or discharge only one of the bit lines BLe, BLo by turning on only one of the switching elements N7, N8.

The bit line coupling circuit 151 includes a switching element N5 and a switching element N6. The switching element N5 is coupled to the even bit line BLe and is operated in response to the even bit line selection signal BSELe. The switching element N6 is coupled to the odd bit line BLo and is operated in response to the odd bit line selection signal BSELo. The bit line coupling circuit 151 couples one of the pair of bit lines BLe, BLo to another circuit (for example, the sensing circuit) in response to the bit line selection signals BSELe, BSELo.

The bit line selection circuit 150 is necessary in the case where one page buffer 160 is allocated to a pair of the even bit line BLe and the odd bit line BLo and may be omitted in the case where the page buffer 160 is allocated to each bit line.

The page buffer 160 is electrically coupled to a bit line selected by the bit line selection circuit 150 through the sensing circuit 170 and is configured to supply voltages, necessary to input and output data to and from a memory cell, to the selected bit line in response to the control signals PB SIGNALS (for example, PRECHb, PTRAN, LAT, and RESET). More particularly, the page buffer 160 precharges the selected bit line (e.g., BLe) during the program verification operation or erase verification operation of a memory cell. The page buffer 160 also senses a sensing current Itrip of the selected bit line (e.g., BLe), varying according to the threshold voltage of a memory cell after a verification voltage is supplied to the memory cell, and latches data corresponding to the sensed threshold voltage of the memory cell. That is, the page buffer 160 controls the voltage level of the selected bit line (e.g., BLe) according to data stored in a memory cell and senses data stored in a memory cell. A detailed configuration and operation of the page buffer 160 is described below.

The page buffer 160 includes a precharge circuit 164 and latch circuits 160A, 160B, and 160C.

The precharge circuit 164 includes a switching element P1 coupled between a power source voltage terminal VDD and a sense node SO and configured to operate in response to a precharge signal PRECHb. The precharge circuit 164 precharges the sense node SO in response to the precharge signal PRECHb.

Hereinafter, for convenience, only one latch circuit (e.g., latch circuit 160A) is described. The latch circuit 160A includes a latch 161, a reset circuit 162, a latch control circuit 163, and a transmission circuit 165. The latch 161 includes two inverters INV1 and INV2 and latches data to be stored in a memory cell or data stored in a memory cell.

The latch control circuit 163 includes switching elements N1 and N2 coupled in series between a ground terminal and a second input terminal QAb of the latch 161. The switching element N1 is operated according to the voltage level of the sense node SO, and the switching element N2 is operated in response to a latch signal LAT. That is, the latch control circuit 163 changes data of the latch 161 to data of a memory cell, in response to the latch signal LAT and the voltage level of the sense node SO varying according to the sensed data of the selected memory cell.

The reset circuit 162 includes a switching element N3. The switching element N3 is coupled between the ground terminal and a first input terminal QA of the latch 161 and is operated in response to a reset signal RESET. The reset circuit 162 performs the reset operation of the latch 161 for resetting data, stored in the latch 161, to a state '0' in response to the reset signal RESET.

The transmission circuit 165 includes a switching element N4. The switching element N4 is coupled between the sense node SO and the first input terminal QA of the latch 161 and is operated in response to a transmission signal PTRAN. The transmission circuit 165 performs an operation of controlling the voltage of the selected bit line (e.g., BLe) according to data latched in the latch 161 in order to store the data in a memory cell when a program operation is performed on the memory cell.

The latch circuits 160A, 160B, and 160C have the same configuration, and different input signals may be inputted to the latch circuits 160A, 160B, and 160C. In some embodiments, each of the latch circuits 160A 160B, and 160C may have a different configuration in order to latch data to be stored in a memory cell, latch a result of a verification operation, or store data read from a memory cell.

The sensing control circuit (170 and 180) performs a function of controlling the level of the sensing current Itrip of a bit line which is sensed in order to detect the data or threshold voltage level of a memory cell. More particularly, the page buffer 160 determines whether the threshold voltage of the memory cell is higher than a target level by sensing the voltage level of the bit line. When the bit line and the page buffer 160 are coupled by the sensing control circuit (170 and 180), the page buffer 160 determines that the threshold voltage level of the memory cell is lower than the target level. On the other hand, if the voltage level of the bit line is high and the bit line and the page buffer 160 are not coupled by the sensing control circuit (170 and 180), the page buffer 160 determines that the threshold voltage level of the memory cell is higher than the target level. In other words, the page buffer 160 differently senses an actual threshold voltage of the memory cell according to the level of the sensing current Itrip which may flow from the bit line to the page buffer 160. The level of the sensing current Itrip is controlled by the sensing control circuit (170 and 180).

The sensing control circuit (170 and 180) includes the sensing voltage generator 180, operated in response to sensing control signals SC SIGNALS of the control circuit 120, and the sensing circuit 170 operated according to voltages V1 and V2 outputted from the sensing voltage generator 180.

The sensing circuit 170 includes a switching element N9 for electrically coupling the selected bit line and the page buffer 160. The sensing circuit 170 performs a function of controlling a voltage precharged in the bit line and the level of the sensing current Itrip which is used for the page buffer 160 to detect the voltage level of the bit line. More particularly, in order to precharge the bit line, the sensing circuit 170 transfers a voltage, outputted from the page buffer 160, to the bit line according to the first voltage V1 of a first level, generated by the sensing voltage generator 180 in the form of a pulse. Next, when the voltage supply circuit (130 and 140) supplies a verification voltage to a selected memory cell and supplies a pass voltage to the remaining memory cells, the voltage precharged in the bit line is maintained or discharged according to the threshold voltage level of the selected memory cell. Next, in order to determine the voltage level of the bit line, the sensing circuit 170 transfers the voltage of the bit line to the sense node SO of the page buffer 160, according to the voltage level of the bit line and the second voltage V2 of a second level lower than the first level, generated by the sensing voltage generator 180 in the form of a pulse. The latch control circuit 163 of the page buffer 160 changes the voltage of the latch unit 161 in response to the latch signal LAT and the voltage level of the sense node SO. Consequently, data stored in the memory cell is sensed. This operation may be applied to a program verification operation, an erase verification operation, and a read operation.

In some embodiments, such as that shown in FIG. 1B, the sensing control circuit 190 may output the bit line selection signal BSELe or BSELo, having a first level or a second level that is lower than the first level, to the bit line selection circuit 150. If the even bit line BLe is selected, the sensing control circuit 190 outputs the even bit line selection signal BSELe of the first level in the form of a pulse and then outputs the even bit line selection signal BSELe of the second level lower than the first level in the form of a pulse. Meanwhile, if the odd bit line BLo is selected, the sensing control circuit 190 outputs the odd bit line selection signal BSELo of the first level in the form of a pulse and then outputs the odd bit line selection signal BSELo of the second level lower than the first level in the form of a pulse.

In this case, the bit line selection circuit 150 (more particularly, the switching elements N5 and N6 of the bit line selection circuit 150) performs the function of the sensing circuit 170 described with reference to FIG. 1A, and so the sensing circuit 170 may be omitted. An example in which the level of the sensing current Itrip is controlled by the sensing control circuit (170 and 180) of FIG. 1A is described below. The pulse levels of the voltages V1, V2 outputted from the sensing voltage generator 180 of the sensing control circuit can be identically applied to the bit line selection signals BSELe, BSELo outputted from the sensing control circuit 190 of FIG. 1B.

Meanwhile, in an operation of sensing the voltage of the bit line in order to perform a program verification operation or an erase verification operation, the bit line is precharged to the first voltage V1 supplied by the sensing voltage generator 180. Next, the voltage level of the bit line may be maintained at or discharged to a voltage, which is precharged according to a verification voltage that is supplied to a selected memory cell, and the threshold voltage of the selected memory cell. The switching element N9 of the sensing circuit 170 may be turned on or off according to the voltage level of the bit line precharged to the first voltage V1 generated by the sensing voltage generator 180, the voltage level of the bit line after the bit line is discharged, or the level of the second voltage V2.

The voltage level of the bit line after the bit line is discharged is changed according to the voltage level of the bit line precharged to the first voltage V1. That is, if the bit line is precharged to a low voltage level, the bit line is discharged up to the low voltage level. If the bit line is precharged to a high voltage level, the bit line maintains a relatively high voltage level after the bit line is discharged although it is discharged. Furthermore, the voltage level of the bit line after the bit line is discharged is changed according to the time elapsing from the time the first voltage V1 is supplied until the time the second voltage V2 is supplied (hereinafter referred to as an 'evaluation time').

A level of the sensing current Itrip is related to conditions in which the switching element N9 of the sensing circuit 170 is turned on. Accordingly, the level of the sensing current Itrip is determined by the level of the first voltage V1, the level of the second voltage V2, and the evaluation time.

In the page buffer 160, a criterion for sensing the threshold voltage level of the memory cell is changed according to the level of the sensing current Itrip. For example, if a bit line maintains a high voltage level after being discharged, the page buffer 160 determines that the threshold voltage of a selected memory cell is higher than a verification voltage, senses the data of the selected memory cell as a state '0', and stores the sensed data in the latch unit 161. Meanwhile, if the bit line maintains a low voltage level after being discharged, the page buffer 160 determines that the threshold voltage of the selected memory cell is lower than the verification voltage, senses the data of the selected memory cell as a state '1', and stores the sensed data in the latch unit 161. Accordingly, if the sensing control circuit (170 and 180) raises the level of the sensing current Itrip, the threshold voltage of the selected memory cell may be sensed as being lower than an actual voltage level. If the sensing control circuit (170 and 180) lowers the level of the sensing current Itrip, the threshold voltage of the selected memory cell may be sensed as being higher than an actual voltage level.

The electrical properties of the semiconductor memory device configured as described above are deteriorated due to cumulative stress resulting from repeated program and erase operations. For example, with an increase of the cumulative stress, the level of an operation voltage supplied to memory cells in order to perform a program operation or an erase operation rises, thereby further increasing the stress.

Accordingly, in order to reduce stress, the level of an operation voltage supplied to memory cells has to be lowered. If the level of the sensing current Itrip is controlled in the verification operation, the level of the operation voltage is lowered, and so stress can be reduced. For example, in the erase operation, an erase voltage gradually falls with a decrease in the level of the sensing current Itrip. Accordingly, if the level of the sensing current Itrip is lowered in the erase verification operation, the result is that an erase start voltage first supplied in the erase operation of an incremental step pulse erase (ISPE) method is lowered.

More particularly, an erase verification level is gradually lowered due to an increased BPD effect resulting from repeated program and erase operations. Accordingly, the level of an erase voltage rises, and stress is increased. If the threshold voltage of a memory cell does not reach a target voltage in the erase verification operation after the erase voltage is supplied in the erase operation of the ISPE method, the erase operation is performed again by supplying an erase voltage raised by a predetermined step voltage. In this case, if the level of the sensing current Itrip is lowered in the erase verification operation, a rise of the erase voltage (that is, the step voltage) can be reduced, and thus, stress can be reduced.

Figure 2:
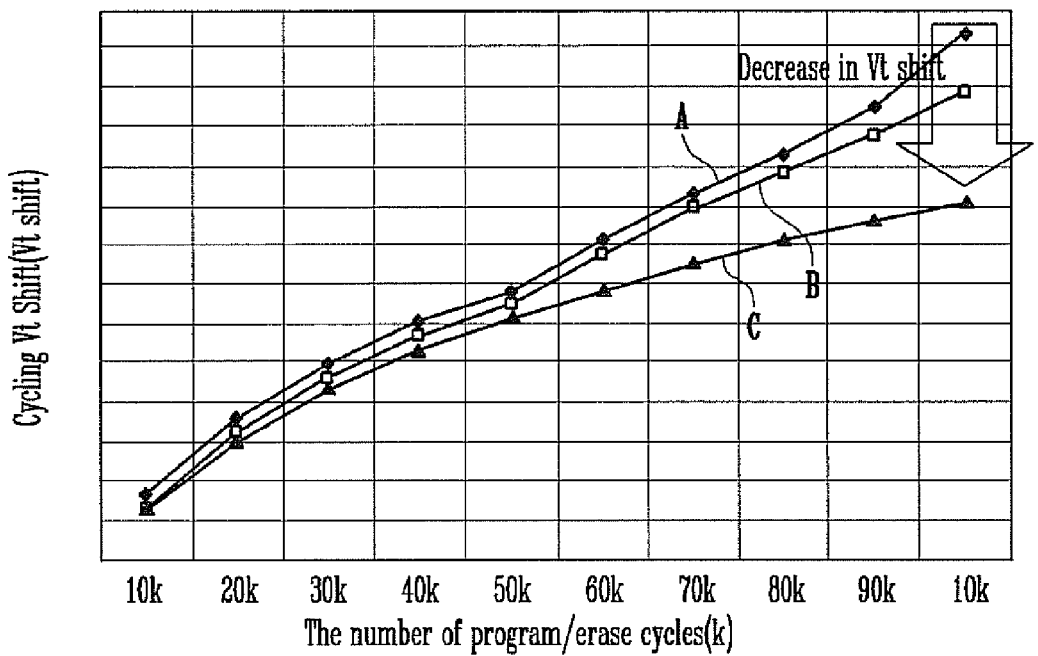
FIG. 2 is a graph illustrating a shift in threshold voltage which occurs with an increase in the number of program and erase cycles.

FIG. 2 is a graph illustrating a shift in threshold voltage which occurs with an increase in the number of program and erase cycles.

From FIG. 2, it can be seen that although the number of program and erase cycles is increased, a threshold voltage is less shifted when the sensing current Itrip is set to a first level A than when the sensing current is set to a second level B, in an erase verification operation. If the sensing current Itrip is set to the lowest functional level C, a shift of the threshold voltage can be minimized. That is, it can be seen that if the level of the sensing current is lowered in the erase verification operation, stress applied to the memory cells can be reduced.

Furthermore, stress can be reduced by setting the sensing current Itrip to a low level in an erase verification operation and/or setting the sensing current Itrip to a low level in a program verification operation, instead of setting the sensing current Itrip to the same level in the program verification operation and the erase verification operation as its amount in the program and erase operations.

Meanwhile, in a flash memory device using a multi-level chip (MLC) method of storing data of 2 bits in one memory cell, the threshold voltage of a memory cell rises up to one of three program levels by means of a program operation according to data to be stored. For example, the threshold voltage of a first memory cell at the lowest PV1 level (a first program level) rises due to a low GM effect, if the threshold voltage of a second memory cell adjacent to the first memory cell rises up to the highest PV3 level (a third program level).

Figure 3:
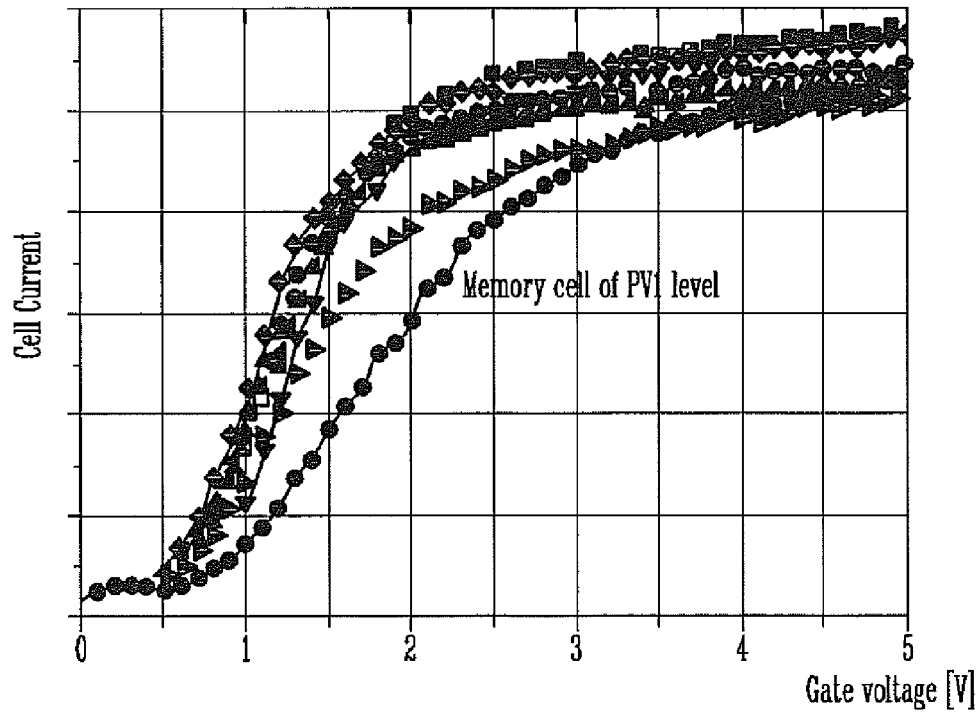
FIG. 3 is a graph illustrating the threshold voltages of memory cells.

FIG. 3 is a graph illustrating the threshold voltages of memory cells.

From FIG. 3, it can be seen that if, after the threshold voltage of a memory cell rises up to a PV1 level, the threshold voltage rises to a level higher than the PV1 level due to a program operation performed on neighboring memory cells, the amount of current flowing through the memory cell is reduced. Consequently, in a read operation for reading data stored in a memory cell, the threshold voltage of the memory cell may be sensed as being high, and thus, erroneous data may be read. This phenomenon may become severe due to cumulative stress.

Meanwhile, the number of electrons, actually injected into the floating gate of a memory cell, and the stress applied to the tunnel oxide layer of the memory cell are increased with an increase in the level of the sensing current Itrip in a program verification operation. Accordingly, in flash memory devices using a multi-level cell (MLC) method, a change in the electrical properties due to stress can be improved by setting the sensing current Itrip to a different level for every program level.

For example, if a program verification operation is performed after a program operation for raising a threshold voltage to the PV1 level, the level of the sensing current may be set high in order to minimize a GM effect. If the threshold voltage of a memory cell is raised up to the highest level (i.e., the PV3 level), the level of the sensing current may be set low so that the number of electrons injected into the floating gate of the memory cell is reduced when a program verification operation is performed. In this case, the degradation of electrical properties resulting from repeated program and erase operations and an interference phenomenon in which the threshold voltages of neighboring memory cells rise can be minimized.

In general, in an erase verification operation, a level of the sensing current Itrip is set to a first level (that is, the lowest level). In a verification operation for raising the threshold voltage of a memory cell up to a PV1 level, the level of the sensing current Itrip is set to a second level higher than the first level. In a verification operation for raising the threshold voltage of the memory cell up to a PV2 level, which is higher than the PV1 level, the level of the sensing current is set to a third level, which is higher than the second level. In a verification operation for raising the threshold voltage of the memory cell up to a PV3 level (a third program level), which is higher than the PV2 level, the level of the sensing current is set to a fourth level higher than the third level. That is, the level of the sensing current is set in proportion to the threshold voltage level of a memory cell to be sensed in the verification operation.

The operations of the circuits for setting the level of the sensing current Itrip as described above are described below.

Referring to FIGS. 1A and 1B, after an erase operation or program operation is performed on memory cells, the sensing voltage generator 180 generates the first voltage V1 in response to the sensing control signals SG SIGNALS generated by the control circuit 120. The sensing circuit 170 transfers a precharge voltage, outputted from the page buffer 160, to the selected bit line (e.g., BLe) according to the first voltage V1 of the sensing voltage generator 180. Accordingly, the selected bit line (e.g., BLe) is precharged up to a level corresponding to V1-Vth (Vth: the threshold voltage of the switching element N9). Next, when the supply of the first voltage V1 is stopped and voltages for a verification operation are supplied to the word lines WL0 to WLn during the evaluation time, a voltage of the selected bit line (e.g., BLe) is changed according to a verification voltage Vpv and the threshold voltage of a selected memory cell. That is, if the threshold voltage of the selected memory cell is higher than the verification voltage Vpv, the voltage of the selected bit line (e.g., BLe) is not changed. If the threshold voltage of the selected memory cell is lower than the verification voltage Vpv, the voltage of the selected bit line (e.g., BLe) is lowered. Next, the supply of the voltages supplied to the word lines WL0 to WLn is stopped.

The sensing voltage generator 180 generates the second voltage V2 so that the page buffer 160 can verify data stored in the selected memory cell according to a threshold voltage level of the selected memory cell. The sensing circuit 170 couples the selected bit line (e.g., BLe) and the page buffer 160 according to the level of the second voltage V2 and the voltage level of the selected bit line (e.g., BLe). More specifically, the transistor N9 of the sensing circuit 170 is turned on only when a voltage level in which the threshold voltage level of the selected memory cell is subtracted from the second voltage V2 supplied to the gate of the selected memory cell is higher than the voltage level of the selected bit line (e.g., BLe). Here, since the threshold voltage has a fixed value, whether the selected bit line (e.g., BLe) and the page buffer 160 are coupled is determined according to the level of the second voltage V2 or the voltage level of the selected bit line (e.g., BLe).

If the level of the second voltage V2 is high or the voltage level of the selected bit line (e.g., BLe) is low, the bit line BLe and the page buffer 160 are coupled, and the threshold voltage of the selected memory cell is sensed as being lower than the verification voltage. On the other hand, if the level of the second voltage V2 is low or the voltage level of the selected bit line (e.g., BLe) is high, the bit line BLe and the page buffer 160 are not coupled, and so the threshold voltage of the memory cell is sensed as being higher than the verification voltage.

The sensing voltage generator 180 generates the second voltage V2, having a higher level when the threshold voltage level of the memory cell is verified after a program operation is performed than when the threshold voltage level of the memory cell is verified after an erase operation is performed. In response to the second voltage V2, the sensing circuit 170 raises the level of the sensing current Itrip higher when the threshold voltage level of the memory cell is verified after the program operation is performed than when the threshold voltage level of the memory cell is verified after the erase operation is performed. In other words, if the threshold voltage level of a memory cell is lowered due to an erase operation, the sensing control circuit (170 and 180) sets the level of the sensing current Itrip to a first level. If the threshold voltage level of the selected memory cell is raised due to an erase operation, the sensing control circuit (170 and 180) sets the level of the sensing current Itrip higher than the first level.

If the threshold voltages of memory cells rise to different levels due to a program operation, the sensing control circuit (170 and 180) sets the level of the sensing current Itrip according to an increase in the threshold voltage levels. For example, if the threshold voltage level of the memory cell rises up to a PV1 level due to a program operation, the sensing control circuit (170 and 180) sets the level of the sensing current Itrip to a second level higher than the first level. If the threshold voltage level of the memory cell rises up to a PV2 level, which is higher than the PV1 level, due to a program operation, the sensing control circuit (170 and 180) sets the level of the sensing current Itrip to a third level higher than the second level. If the threshold voltage level of the memory cell rises up to a PV3 level, which is higher than the PV2 level, due to a program operation, the sensing control circuit (170 and 180) sets the level of the sensing current Itrip to a fourth level higher than the third level.

In order to set the level of the sensing current Itrip as described above, the sensing voltage generator 180 generates the second voltage V2 having a higher level when the data of the memory cell is verified after a program operation than when the data of the memory cell is verified after an erase operation is performed. That is, the sensing voltage generator 180 raises the level of the second voltage V2 in proportion to the threshold voltage level of a memory cell to be sensed.

For example, if the threshold voltage level of a memory cell is lowered due to an erase operation, the sensing voltage generator 180 generates the second voltage V2 at a first sensing level. If the threshold voltage level rises up to the PV1 level due to a program operation, the sensing voltage generator 180 generates the second voltage V2 having a second sensing level higher than the first sensing level. If the threshold voltage level rises up to the PV2 level, which is higher than the PV1 level, the sensing voltage generator 180 generates the second voltage V2 having a third sensing level higher than the second sensing level. If the threshold voltage level rises up to the PV3 level, which is higher than the PV2 level, the sensing voltage generator 180 generates the second voltage V2 having a fourth sensing level higher than the third sensing level.

Figure 4:
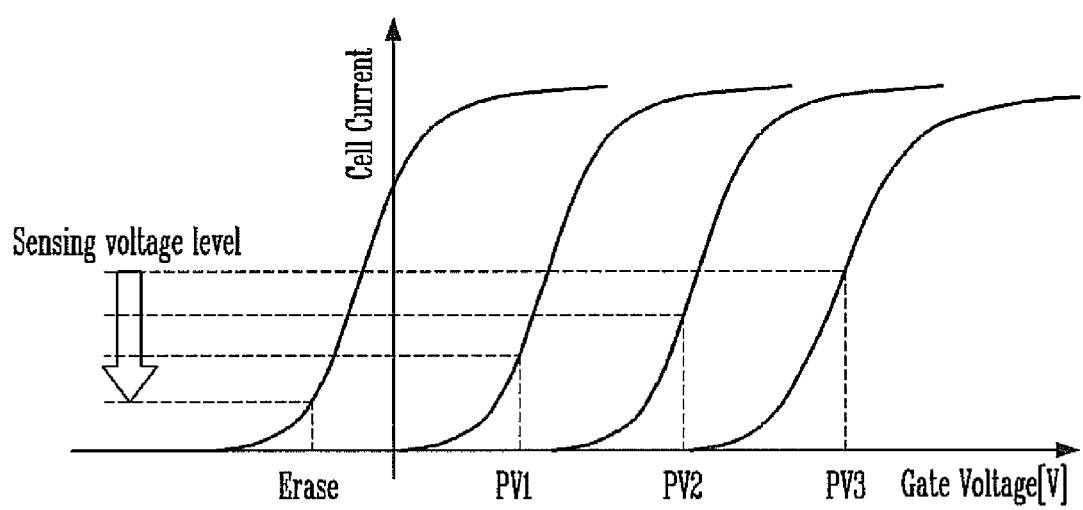
FIG. 4 is a diagram illustrating the level of a sensing current which is changed according to the threshold voltage level of a memory cell.

FIG. 4 is a diagram illustrating the level of a sensing current which is changed according to the threshold voltage level of a memory cell.

Referring to FIG. 4, when the level of the second voltage V2 generated by the sensing voltage generator 180 is changed as described above, the level of the sensing current Itrip is changed, and so the threshold voltage level of the memory cell is differently sensed.

As described above, the level of the sensing current supplied from the bit line to the page buffer in order to verify the data of a memory cell is controlled according to a threshold voltage level of the memory cell which is changed due to a program operation or an erase operation. Accordingly, the degradation of physical and electrical properties of a memory device and the generation of stress due to repeated program and erase operations can be minimized.

The method of controlling the level of the second voltage V2 by controlling the level of the sensing current Itrip has been described above. However, in some embodiments, the level of the sensing current Itrip may be controlled through control of the precharge level of the first voltage V1 generated in order to precharge the bit line. For example, if the precharge level of the first voltage V1 rises, voltage precharged in the bit line also rises. Thus, when the second voltage V2 is supplied to the sensing circuit 170, the level of the sensing current Itrip rises. Accordingly, if the level of the second voltage V2 is raised in proportion to the threshold voltage level of a memory cell to be sensed as in the first voltage V1, the level of the sensing current can be raised in proportion to the threshold voltage level of the memory cell.

In some embodiments, the level of the sensing current Itrip may be controlled through control of the evaluation time, which is the time elapsing from the time the first voltage V1 is supplied until the second voltage V2 is reached. For example, if the evaluation time increases, the level of the sensing current Itrip falls. On the other hand, if the evaluation time decreases, the level of the sensing current Itrip rises. Thus, if the evaluation time is controlled in inverse proportion to the threshold voltage level of a memory cell to be sensed, the level of the sensing current can be raised in proportion to the threshold voltage level of the memory cell.

For example, if the threshold voltage level of a memory cell is lowered due to an erase operation, the evaluation time may be set to a first value. If the threshold voltage level of the memory cell rises up to a PV1 level due to a program operation, the level of the sensing current may be set to a second level higher than the first level. If the threshold voltage level rises up to a PV2 level higher than the PV1 level due to the program operation, the sensing control circuit may set the level of the sensing current to a third level than the second level. If the threshold voltage level rises up to a PV3 level higher than the PV2 level due to the program operation, the sensing control circuit may set the level of the sensing current to a fourth level higher than the third level.

In view of the above description, it should be evident to those skilled in the art that the level of the sensing current may be controlled by using all the above methods or selectively using the above methods.

According to the present disclosure, conditions for sensing the threshold voltage of a memory cell are differently set according to a state of the threshold voltage. Accordingly, the degradation of physical and electrical properties of a memory device due to repeated program and erase operations can be minimized, and reliability of the operation can be improved.

What is claimed is:

1. A semiconductor memory device, comprising:
a memory string coupled to a bit line;
a page buffer configured to sense a sensing current of the bit line in an erase verification operation or a program verification operation; and
a sensing control circuit configured to differently set a level of the sensing current in the erase verification operation and the program verification operation in order to sense the threshold voltage level of a selected memory cell of the memory string.

2. The semiconductor memory device of claim 1, wherein the sensing control circuit controls the level of the sensing current in proportion to the threshold voltage level of the selected memory cell.

3. The semiconductor memory device of claim 1, wherein:
the level of the sensing current for the erase verification operation is set to a first level,
the level of the sensing current for a program verification operation of a first program level is set to a second level which is higher than the first level,
the level of the sensing current for a program verification operation of a second program level is set to a third level which is higher than the second level, and
the level of the sensing current for a program verification operation of a third program level is set to a fourth level which is higher than the third level.

4. The semiconductor memory device of claim 1, wherein the level of the sensing current of the bit line in the program verification operation is higher than the level of the sensing current of the bit line in the erase verification operation.

5. The semiconductor memory device of claim 1, wherein the sensing control circuit comprises:
a sensing voltage generator configured to generate a first voltage when the bit line is precharged and to generate a second voltage, which is lower than the first voltage, when the sensing current is supplied from the bit line to the page buffer; and
a sensing circuit configured to control a connection of the bit line and the page buffer according to the first voltage or the second voltage.

6. The semiconductor memory device of claim 5, wherein the sensing voltage generator generates the second voltage, having a higher level when data of the selected memory cell is verified in the program verification operation than when the data of the selected memory cell is verified in the erase verification operation.

7. The semiconductor memory device of claim 6, wherein:
the sensing voltage generator generates the second voltage having a first sensing level in the erase verification operation,
the sensing voltage generator generates the second voltage having a second sensing level, which is higher than the first sensing level, in a program verification operation of a first program level,
the sensing voltage generator generates the second voltage having a third sensing level, which is higher than the second sensing level, in a program verification operation of a second program level, and
the sensing voltage generator generates the second voltage having a fourth sensing level, which is higher than the third sensing level, in a program verification operation of a third program level.

8. The semiconductor memory device of claim 5, wherein the sensing voltage generator generates the rust voltage, having a higher level when data of the selected memory cell is verified in the program verification operation than when the data of the selected memory cell is verified in the erase verification operation.

9. The semiconductor memory device of claim 8, wherein:
the sensing voltage generator generates the first voltage having a first precharge level in the erase verification operation,
the sensing voltage generator generates the first voltage having a second precharge level, which is higher than the first precharge level, in a program verification operation of a first program level,
the sensing voltage generator generates the first voltage having a third precharge level, which is higher than the second precharge level, in a program verification operation of a second program level, and
the sensing voltage generator generates the first voltage having a fourth precharge level, which is higher than the third precharge level, in a program verification operation of a third program level.

10. The semiconductor memory device of claim 5, wherein an evaluation time is decreased by the sensing voltage generator, which elapses from the time the first voltage is supplied until the second voltage is supplied, when the program verification operation is performed than when the erase verification operation is performed.

11. The semiconductor memory device of claim 10, wherein:
the evaluation time is set to a first value in the erase verification operation,
the evaluation time is set to a second value, which is less than the first value, in a program verification operation of a first program level,
the evaluation time is set to a third value, which is less than the second value, in a program verification operation of a second program level, and the evaluation time is set to a fourth value, which is less than the third value, in a program verification operation of a third program level.

12. A method of operating a semiconductor memory device, the method comprising:
- performing an erase operation on a memory string coupled to a bit line;
- after the erase operation, setting a level of a sensing current to a first level and performing an erase verification operation for verifying a stored data in a selected memory cell of the memory string;
- performing a program operation on the selected memory cell; and
- after the program operation, setting a level of the sensing current for a program verification operation to one of several program levels which is higher than the first level and performing the program verification operation for verifying the stored data in the memory cell.

13. The method of claim 12, wherein setting a level of the sensing current for the program verification operation comprises:
- setting the level of the sensing current to a second level in a program verification operation of a first program level,
- setting the level of the sensing current to a third level which is higher than the second level in a program verification operation of a second program level, and
- setting the level of the sensing current to a fourth level which is higher than the third level in a program verification operation of a third program level.

14. A method of operating a semiconductor memory device, the method comprising:
- performing an erase operation on a memory string coupled to a bit line;
- precharging the bit line to a first bit line voltage after the erase operation;
- performing an erase verification operation by sensing a change of a voltage of the bit line;
- performing a program operation on a selected memory cell;
- precharging the bit line to one of several bit line voltages, which is higher than the first bit line voltage, after the program operation; and
- performing a program verification operation by sensing a change of a voltage of the bit line.

15. The method of claim 14, wherein precharging the bit line after the program operation comprises:
- precharging the bit line to a second bit line voltage, which is higher than the first bit line voltage in a program verification operation of a first program level,
- precharging the bit line to a third bit line voltage, which is higher than the second bit line voltage in a program verification operation of a second program level, and
- precharging the bit line to a fourth bit line voltage, which is higher than the third bit line voltage in a program verification operation of a third program level.

16. A method of operating a semiconductor memory device, the method comprising:
- performing an erase operation on a memory string coupled to a bit line;
- precharging the bit line after performing the erase operation;
- performing an erase verification operation by sensing a change of a voltage of the bit line after an evaluation time having a first value;
- performing a program operation on a selected memory cell;
- precharging the bit line after performing the program operation; and
- performing a program verification operation by sensing a change of a voltage of the bit line after an evaluation time having one value of several values, which is less than the first value.

17. The method of claim 16, wherein the evaluation time is a time for which data stored in the selected memory cell is verified, and is a time elapsing from a time when a first voltage for precharging the bit line is supplied until a second voltage for sensing the change of the voltage of the bit line is supplied.

18. The method of claim 16, wherein:
- the evaluation time is set to a second value which is less than the first value in a program verification operation of a first program level,
- the evaluation time is set to a third value which is less than the second value in a program verification operation of a second program level, and
- the evaluation time is set to a fourth value which is less than the third value in a program verification operation of a third program level.

* * * * *